(12) United States Patent
Son

(10) Patent No.: US 12,417,813 B2
(45) Date of Patent: Sep. 16, 2025

(54) MEMORY DEVICE FOR OUTPUTTING TEST RESULTS

(71) Applicant: Samsung Electronics Co., Ltd., Suwon-si (KR)

(72) Inventor: Jongpil Son, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 121 days.

(21) Appl. No.: 18/062,843

(22) Filed: Dec. 7, 2022

(65) Prior Publication Data

US 2023/0178169 A1    Jun. 8, 2023

(30) Foreign Application Priority Data

Dec. 8, 2021  (KR) .................. 10-2021-0175215
May 6, 2022   (KR) .................. 10-2022-0056242

(51) Int. Cl.
| | | |
|---|---|---|
| *G11C 11/34* | (2006.01) | |
| *G11C 29/00* | (2006.01) | |
| *G11C 29/18* | (2006.01) | |
| *G11C 29/44* | (2006.01) | |

(52) U.S. Cl.
CPC .......... *G11C 29/4401* (2013.01); *G11C 29/18* (2013.01); *G11C 29/785* (2013.01)

(58) Field of Classification Search
CPC .... G11C 29/4401; G11C 29/18; G11C 29/785
USPC .................................................... 365/185.09
See application file for complete search history.

(56) References Cited

U.S. PATENT DOCUMENTS

| | | | | |
|---|---|---|---|---|
| 5,659,551 A | * | 8/1997 | Huott | G06F 11/22 |
| | | | | 714/E11.166 |
| 6,449,748 B1 | | 9/2002 | Jeng et al. | |
| 6,691,264 B2 | * | 2/2004 | Huang | G11C 29/44 |
| | | | | 365/201 |
| 7,187,603 B2 | * | 3/2007 | Nagata | G11C 29/4401 |
| | | | | 365/201 |
| 7,397,715 B2 | | 7/2008 | Lim | |
| 7,773,438 B2 | * | 8/2010 | Fekih-Romdhane | ........... |
| | | | | G11C 7/1006 |
| | | | | 365/185.11 |

(Continued)

FOREIGN PATENT DOCUMENTS

| | | |
|---|---|---|
| JP | 2013-219084 A | 10/2013 |
| KR | 10-2008-0068206 A | 7/2008 |
| KR | 10-2021-0082769 A | 7/2021 |

*Primary Examiner* — Viet Q Nguyen

(74) *Attorney, Agent, or Firm* — Harness, Dickey & Pierce, P.L.C.

(57) ABSTRACT

A memory device includes a memory cell array and a repair circuit configured to perform a repair operation and output a dirty signal to an external destination external to the memory device. The repair circuit further performs selecting a first redundancy address of the redundancy memory cells instead of a first fail address of the first failed memory cell, storing a first redundancy mapping for the first fail address to the first redundancy address, and in response to determining a second fail address of a second failed memory cell matches the first fail address, ignoring the first redundancy mapping, and outputting a dirty signal causing a second redundancy mapping to map the first fail address to a second redundancy address different from the first redundancy address of the redundancy memory cells.

20 Claims, 11 Drawing Sheets

(56) References Cited

U.S. PATENT DOCUMENTS

| | | | |
|---|---|---|---|
| 7,941,712 B2 | 5/2011 | Mohr et al. | |
| 8,624,242 B2 | 1/2014 | Kojima et al. | |
| 8,854,908 B1* | 10/2014 | Burstein | G11C 29/846 |
| | | | 365/201 |
| 9,348,679 B2* | 5/2016 | Yoo | G11C 29/78 |
| 9,406,403 B2* | 8/2016 | Loh | G11C 29/76 |
| 9,564,247 B2* | 2/2017 | Shim | G11C 29/78 |
| 9,747,998 B2* | 8/2017 | Kim | G11C 29/44 |
| 9,953,725 B2* | 4/2018 | Ryu | G11C 29/52 |
| 10,094,869 B2 | 10/2018 | Kim | |
| 10,115,479 B2* | 10/2018 | Kim | G11C 29/24 |
| 10,127,103 B2* | 11/2018 | Genshaft | G06F 11/1068 |
| 10,330,726 B2 | 6/2019 | Werhane et al. | |
| 10,629,546 B2 | 4/2020 | Roh | |
| 10,832,791 B2 | 11/2020 | Wilson | |
| 11,334,423 B2 | 5/2022 | Park | |
| 11,373,726 B2* | 6/2022 | Varadarajan | G06F 11/273 |
| 2003/0103394 A1* | 6/2003 | Koshikawa | G11C 29/785 |
| | | | 365/200 |
| 2003/0116763 A1* | 6/2003 | Yamazaki | G11C 29/1201 |
| | | | 257/48 |
| 2003/0147291 A1* | 8/2003 | Kim | G11C 29/785 |
| | | | 365/230.06 |
| 2004/0225912 A1* | 11/2004 | Ronza | G11C 29/81 |
| | | | 714/5.1 |
| 2004/0261049 A1* | 12/2004 | Mohr | G11C 29/44 |
| | | | 714/710 |
| 2008/0175079 A1* | 7/2008 | Jeon | G11C 29/846 |
| | | | 365/201 |
| 2009/0158224 A1* | 6/2009 | Barth, Jr. | G11C 29/72 |
| | | | 716/136 |
| 2013/0028036 A1* | 1/2013 | Deng | G11C 29/50 |
| | | | 365/201 |
| 2014/0140153 A1* | 5/2014 | Son | G11C 29/806 |
| | | | 365/200 |
| 2018/0182467 A1* | 6/2018 | Kang | G11C 29/80 |
| 2019/0164911 A1 | 5/2019 | Pan et al. | |
| 2019/0304565 A1* | 10/2019 | Kim | G11C 29/781 |
| 2020/0133769 A1* | 4/2020 | Bains | G06F 11/1048 |
| 2022/0113889 A1* | 4/2022 | Park | G11C 29/022 |

* cited by examiner

| INDEX | MASTER 520 | F_ADDR [BA:RA] 510 | | | | | | | | | |
|---|---|---|---|---|---|---|---|---|---|---|---|
| 1 | 1 | 0 | 0 | 0 | 0 | 0 | 0 | 0 | 0 | 0 | 0 |
| 2 | 1 | 0 | 0 | 0 | 0 | 0 | 1 | 1 | 0 | 0 | 0 |
| 3 | 1 | 0 | 0 | 0 | 0 | 0 | 0 | 0 | 1 | 0 | 0 |
| 4 | 1 | 0 | 0 | 0 | 0 | 1 | 1 | 0 | 0 | 0 | 0 |
| 5 | 1 | 0 | 0 | 0 | 1 | 0 | 1 | 0 | 0 | 0 | 0 |
| 6 | 1 | 0 | 0 | 1 | 0 | 1 | 0 | 0 | 0 | 1 | 0 |
| 7 | 1 | 0 | 0 | 0 | 1 | 0 | 1 | 0 | 0 | 0 | 0 |
| 8 | 1 | 0 | 0 | 1 | 0 | 0 | 0 | 1 | 0 | 0 | 0 |

FIG. 7

| INDEX | MASTER 720 | Dirty 730 | F_ADDR [BA:RA] 710 | | | | | | | | | |
|---|---|---|---|---|---|---|---|---|---|---|---|---|
| 1 | 1 | 0 | 0 | 0 | 0 | 0 | 0 | 0 | 0 | 0 | 0 | 0 |
| 2 | 1 | 0 | 0 | 0 | 0 | 0 | 0 | 1 | 1 | 0 | 0 | 0 |
| 3 | 1 | 0 | 0 | 0 | 0 | 0 | 0 | 0 | 0 | 1 | 0 | 0 |
| 4 | 1 | 0 | 0 | 0 | 0 | 0 | 1 | 1 | 0 | 0 | 0 | 0 |
| 5 | 1 | 0 | 0 | 0 | 0 | 1 | 0 | 1 | 0 | 0 | 0 | 0 |
| 6 | 1 | 0 | 0 | 0 | 1 | 0 | 1 | 0 | 0 | 0 | 1 | 0 |
| 7 | 1 | 0 | 0 | 0 | 0 | 1 | 0 | 1 | 0 | 0 | 0 | 0 |
| 8 | 1 | 0 | 0 | 0 | 1 | 0 | 0 | 0 | 1 | 0 | 0 | 0 |

| INDEX | MASTER 720 | Dirty 730 | F_ADDR [BA:RA] 710 | | | | | | | | | |
|---|---|---|---|---|---|---|---|---|---|---|---|---|
| 1 | 1 | 0 | 0 | 0 | 0 | 0 | 0 | 0 | 0 | 0 | 0 | 0 |
| 2 | 1 | 0 | 0 | 0 | 0 | 0 | 0 | 1 | 1 | 0 | 0 | 0 |
| 3 | 1 | 0 | 0 | 0 | 0 | 0 | 0 | 0 | 0 | 1 | 0 | 0 |
| 4 | 1 | 0 | 0 | 0 | 0 | 0 | 1 | 1 | 0 | 0 | 0 | 0 |
| 5 | 1 | 1 | 0 | 0 | 0 | 1 | 0 | 1 | 0 | 0 | 0 | 0 |
| 6 | 1 | 0 | 0 | 0 | 1 | 0 | 1 | 0 | 0 | 0 | 1 | 0 |
| 7 | 1 | 0 | 0 | 0 | 0 | 1 | 0 | 1 | 0 | 0 | 0 | 0 |
| 8 | 1 | 0 | 0 | 0 | 1 | 0 | 0 | 0 | 1 | 0 | 0 | 0 |
| 9 | 1 | 0 | 0 | 0 | 0 | 1 | 0 | 1 | 0 | 0 | 0 | 0 |

600

MEMORY DEVICE FOR OUTPUTTING TEST RESULTS

CROSS-REFERENCE TO RELATED APPLICATIONS

This U.S. non-provisional application is based on and claims the benefit of priority under 35 U.S.C. § 119 to Korean Patent Application Nos. 10-2021-0175215, filed on Dec. 8, 2021, and 10-2022-0056242, filed on May 6, 2022, in the Korean Intellectual Property Office, the disclosures of each of which are incorporated by reference herein in their entireties.

BACKGROUND

Various example embodiments of the inventive concepts relate to semiconductor devices, and more particularly, to a memory device, a system including the memory device, a method of testing a memory device, and/or a non-transitory computer readable medium including computer readable instructions for testing a memory device and outputting a result of a package test performed by using low-performance test equipment to the low-performance test equipment for cost reduction.

Semiconductor chips are manufactured through a semiconductor manufacturing process and tested by test equipment in the state of a semiconductor wafer, a die, or a package. Defects or defective chips are selected and/or identified through a test (e.g., a defect test, etc.), and, when some memory cells are identified as being defective, a repair operation is performed to rescue and/or repair a semiconductor chip. As semiconductor chips like dynamic random-access memories (DRAMs) continue to be miniaturized, errors are more likely occur during the semiconductor manufacturing process. Also, errors may occur during chip operation even when an error was not detected during an initial test (e.g., a test performed during the manufacturing stage).

Demands for high-capacity DRAM are increasing due to increasing demands for stable and fast real-time processing of large amounts of data. However, the performance quality of DRAM may change over time. A memory system may expect reliability, availability and serviceability (RAS) capability for DRAM. Therefore, DRAM may include a built-in self-test (BIST) circuit which performs a test operation and/or a repair operation on a memory cell array (MCA). The BIST circuit is a Test Pattern Generation (TPG) circuit which provides test patterns for detecting defective cells in the MCA, and a built-in self-repair (BISR) circuit includes a built-in redundancy analysis (B IRA) circuit which controls the defective memory cells of the MCA to be repaired to the redundant memory cells, and the like. Since such a BIST circuit has a complicated hardware configuration and occupies a large physical area of a DRAM chip, some DRAMs may not provide this capability.

On the other hand, a process of testing DRAM may include an electrical die sorting (EDS) test which tests wafer-state chips, a package test that is performed after a chip determined as good in the EDS test is packaged through an assembly process, a module test that is performed after a good packaged chip is mounted on a module, and a mounting test that is performed after a good module is mounted on a board. Pass or fail for a memory chip is determined according to the presence or absence of a defect in each test stage. In a general testing method, to secure good products, passed samples of respective stages are processed up to a final module/mounting test, final passed samples are processed as good products, and defective samples of the respective stages are processed as failed products.

Test equipment used for an EDS test may include expensive, high-performance test equipment to initially determine whether a memory cell has failed, and to determine whether a failure may be repaired. Test equipment used for package testing may perform a DC parameter test, a dynamic function test, a device sort verification test, and/or a low-power test of a packaged DRAM chip, and may include relatively and/or sometimes inexpensive low-performance test equipment in comparison to the test equipment for an EDS test. When a package test fails, a post package repair (PPR) may be performed on a corresponding DRAM chip. When a DRAM chip fails after the PPR, the DRAM chip may be processed as a defective product.

When a DRAM chip which does not include a BIST circuit fails after a PPR in a package test performed using low-performance test equipment and is still repairable, productivity may be improved.

SUMMARY

Various example embodiments of the inventive concepts provide a memory device, a system including the memory device, a non-transitory computer readable medium including computer readable instructions for performing a method of testing a memory device, and/or a method of testing a memory device for outputting a test result of a repair operation to a test device to improve productivity.

According to at least one example embodiment of the inventive concepts, there is provided a memory device including a memory cell array comprising a plurality of memory cells arranged at intersections of a plurality of rows, and a plurality of columns and redundancy memory cells configured to repair a failed memory cell from among the memory cells, and a repair circuit configured to perform a repair operation on the failed memory cell, and output a dirty signal to an external destination external to the memory device, the repair operation including, selecting a first redundancy address of the redundancy memory cells instead of a first fail address of the first failed memory cell, storing a first redundancy mapping for the first fail address to the first redundancy address, and in response to determining a second fail address of a second failed memory cell matches the first fail address, ignoring the first redundancy mapping, and outputting a dirty signal causing a second redundancy mapping to map the first fail address to a second redundancy address different from the first redundancy address of the redundancy memory cells.

According to at least one example embodiment of the inventive concepts, there is provided a memory device including a memory cell array comprising a plurality of memory cells arranged at intersections of a plurality of rows and a plurality of columns, and redundancy memory cells configured to repair a failed memory cell from among the plurality of memory cells, and a repair circuit configured to, perform a repair operation on the failed memory cell, and output an overflow flag signal to an external destination external to the memory device, the repair operation including, selecting a first redundancy address of the redundancy memory cells instead of a first fail address of a first failed memory cell from among the plurality of memory cells, storing first redundancy mapping for the first fail address to the first redundancy address, and outputting the overflow flag signal indicating that a storage space to store second redundancy mapping for a second fail address of a second failed memory cell from among the plurality of memory cells to a second redundancy address is insufficient.

According to at least one example embodiment of the inventive concepts, there is provided a memory device including a memory cell array comprising a plurality of memory cells arranged at intersections of a plurality of rows and a plurality of columns, and redundancy memory cells configured to repair a failed memory cell from among the plurality of memory cells, and a repair circuit configured to, perform a memory test operation on the memory cell array after performing a repair operation on the failed memory cell, and output a first signal to an external destination external to the memory device, the first signal being obtained as a result of the memory test operation and indicating failure of a repaired redundancy memory cell.

According to at least one example embodiment of the inventive concepts, there is provided a method of testing a memory device including a plurality of memory cells and a plurality of redundancy memory cells, the method including performing a first repair operation on a first failed memory cell from among the plurality of memory cells, that the first repair operation including selecting a first redundancy address of the redundancy memory cells instead of a first fail address of the first failed memory cell, storing first redundancy mapping for the first fail address to the first redundancy address according to results of the first repair operation, comparing a second fail address of a second failed memory cell from among the plurality of memory cells with the first fail address, ignoring the first redundancy mapping in response to the second fail address matching the first fail address, generating a dirty signal based on results of the comparing, the dirty signal causing a second redundancy mapping for the first fail address to a second redundancy address different from the first redundancy address, and outputting the dirty signal to a test host device external to the memory device.

BRIEF DESCRIPTION OF THE DRAWINGS

Various example embodiments of the inventive concepts will be more clearly understood from the following detailed description taken in conjunction with the accompanying drawings in which:

FIG. 5 is a diagram for illustrating a fail address memory (FAM) of FIG. 4 according to at least one example embodiment;

FIGS. 6 to 8 are diagrams for illustrating a repair address storage circuit of FIG. 4 according to some example embodiments;

DETAILED DESCRIPTION

Figure 1:
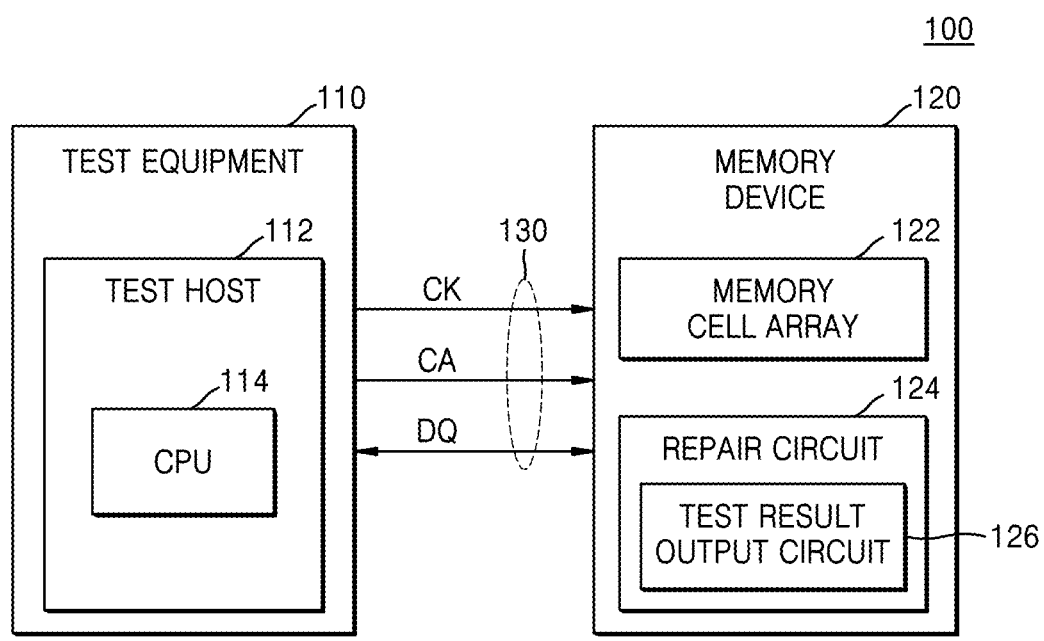
FIG. 1 is a conceptual diagram for illustrating a test system for testing a memory device according to some example embodiments.
Figure 2:
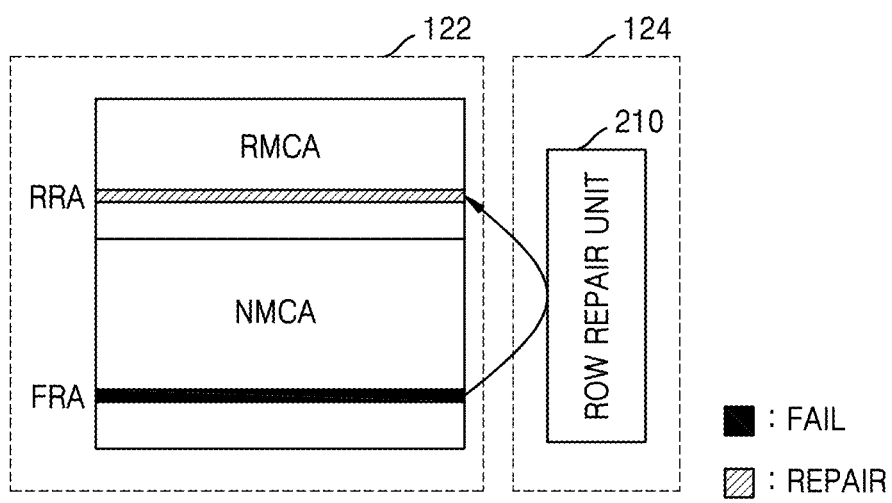
FIGS. 2 and 3 are diagrams for illustrating a post package repair (PPR) operation by a repair circuit of FIG. 1 according to some example embodiments.
Figure 3:
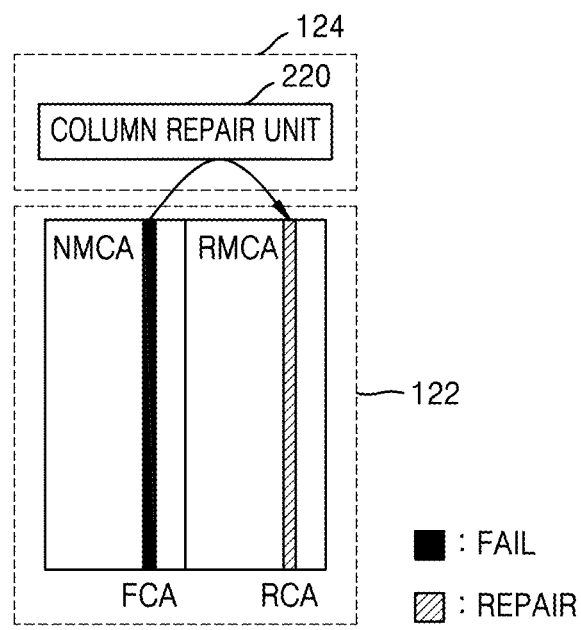

FIG. 1 is a conceptual diagram for illustrating a test system for testing a memory device according to some example embodiments. FIGS. 2 and 3 are diagrams for illustrating a post package repair (PPR) operation by a repair circuit 124 of FIG. 1 according to some example embodiments.

Referring to FIG. 1, a method of testing a memory device 120 in a test system 100 performed by test equipment 110 is shown. The test equipment 110 may include at least one test host 112 (e.g., a test host device, a host device, etc.) which tests at least one memory device 120 (e.g., memory, etc.), which is a device under test (DUT). The test host 112 may include at least one central processing unit 114 (e.g., processing circuitry, processor, etc.) which controls hardware, software, and/or firmware for performing a test operation on the memory device 120. For example, central processing unit 114 may be implemented as processing circuitry, and the processing circuitry may include hardware including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto. The test host 112 may transmit a test signal from the central processing unit 114 to the memory device 120 and/or may transmit test results of the memory device 120 to the central processing unit 114, etc., but is not limited thereto.

The test host 112 may be implemented as a test program (e.g., test program code, test computer readable instructions, etc.). A test program may include a test algorithm and/or a test pattern for performing a test operation, but is not limited thereto. For example, the test host 112 may store particular and/or desired data in at least one storage region of a DUT, (e.g., a memory cell array 122 of the memory device 120), read the particular data, and determine pass/fail of a test operation based on whether read data is identical to the particular data. The test host 112 may measure changes in a voltage, a current, and/or a frequency under various driving conditions for the memory device 120 to test whether the ranges of the changes are within allowable and/or desirable ranges.

The memory device 120 may be implemented as random-access memories (DRAM), but is not limited thereto. For example, the memory device 120 may correspond to double data rate synchronous dynamic random access memory (DDR SDRAM), low power double data rate LPDD (LPDDR) SDRAM, graphics double data rate (GDDR) SDRAM, Rambus dynamic random access memory (RDRAM), etc. Additionally, the memory device 120 may be implemented as static DRAM (SDRAM), high bandwidth memory (HBM), and/or processor-in-memory (PIM), etc.

According to at least one example embodiment, the memory device 120 may be implemented as a non-volatile memory device. For example, the memory device 120 may be implemented as a flash memory and/or a resistive memory, such as phase change RAM (PRAM), magnetic RAM (MRAM), and/or resistive RAM (RRAM), etc.

The test host 112 may test the memory device 120 through a channel 130. The channel 130 may include at least one bus that physically and/or electrically connects the test host 112 to the memory device 120. For example, a clock signal CK is received by the memory device 120 through a clock bus, a command and/or an address CA are received by the memory device 120 through a CA bus, and data DQ is provided between the test host 112 and the memory device 120 through a data bus. For the sake of clarity and brevity in the drawing, it is shown that a signal is transmitted through one signal line between the test host 112 and the memory device 120. However, in reality, each bus may include one or more signal lines through which signals are provided, and thus the example embodiments are not limited thereto.

The test host 112 may provide at least one command to the memory device 120 to test at least one memory operation, etc. Non-limiting examples of a memory command may include a timing command for controlling timings of various operations, an access command for accessing a memory (e.g., a read command for performing a read operation and a write command for performing a write operation), a mode register write command for performing a mode register write operation, a mode register read command for performing a mode register read operation, a PPR command, etc.

During a first example of a memory operation test of the memory device 120, when (and/or in response to) a write command and an associated address (e.g., memory address associated with the memory operation, etc.) are provided to the memory device 120 by the test host 112, the memory device 120 may receive the write command and the associated address and perform a write operation, thereby writing data to be written from the test host 112 to a memory location corresponding to the associated address, but the example embodiments are not limited thereto. Data to be written is provided to the memory device 120 by the test host 112 according to and/or based on a timing associated with the reception of a write command. For example, the timing may be based on a write latency (WL) value indicating the desired number of clock cycles after a write command when data to be written is provided to the memory device 120 by the test host 112, but the example embodiments are not limited thereto. The WL value may be programmed to a mode register set (MRS) of the memory device 120 by the test host 112, etc. The MRS of the memory device 120 may be programmed with information for setting various operation modes (e.g., memory operation modes, memory device operation modes, etc.) and/or for selecting features for a memory operation.

During a second example of a memory operation test, when (and/or in response to) a read command and an associated address are provided to the memory device 120 by the test host 112, the memory device 120 may receive the read command and the associated address and perform a read operation, thereby outputting read data from a memory location corresponding to the associated address. The read data may be provided to the test host 112 by the memory device 120 according to and/or based on a timing related to reception of a read command. For example, the timing may be based on a read latency (WL) value indicating the desired number of clock cycles after a read command when read data is provided to the test host 112 by the memory device 120, but the example embodiments are not limited thereto. The RL value may be set to the memory device 120 by the test host 112. For example, the RL value may be programmed to the MRS of the memory device 120, etc.

The test host 112 may provide a PPR command and a fail address (e.g., a failed address, a failed memory address, etc.) to the memory device 120. The PPR command is a command instructing to store a fail address (e.g., a memory address corresponding to failed memory cells/blocks, etc.) detected after the memory device 120 is packaged in a non-volatile memory (e.g., a fuse array, etc.) in the memory device 120 and to perform a repair operation on the fail address. In response to the PPR command, the memory device 120 may perform a PPR operation to replace a fail word line (e.g., a failed word line, etc.) selected by a fail address with a redundancy word line and/or to replace a fail bit line selected by a fail address with a redundancy bit line.

The memory device 120 may include the memory cell array 122 and the repair circuit 124, etc., but is not limited thereto. The memory cell array 122 may include a plurality of rows, a plurality of columns, and a plurality of memory cells respectively formed at intersections of the rows and the columns. The memory cells of the memory cell array 122 may be volatile memory cells, e.g., DRAM cells. Also, the memory cell array 122 may include redundancy rows and/or redundancy columns to which redundancy memory cells for repairing a defective memory cell when a defect and/or a failure occurs in memory cells are connected.

The repair circuit 124 may be configured to repair defective and/or failed memory cells detected in the memory cell array 122 by using redundant memory cells. The repair circuit 124 may repair defective cells detected through an EDS test after the manufacturing process of the memory device 120, but the example embodiments are not limited thereto. Also, the repair circuit 124 may perform a PPR operation for repairing fail memory cells generated during package/module/mounting test of the memory device 120 by using redundancy memory cells, but the example embodiments are not limited thereto.

The repair circuit 124 may perform a PPR operation to replace each of a fail row address FRA and/or a fail column address FCA with a redundancy row address RRA and/or a redundancy column address RCA, as shown in FIGS. 2 and 3. In FIG. 2, the repair circuit 124 may repair the fail row address FRA associated with a fail memory cell by using the redundancy row address RRA (e.g., replacing the row address corresponding to the detected failed memory cell with the redundancy row address RRA). A memory cell array 122 may include the normal cell array NMCA and a redundancy memory cell array RMCA (e.g., the redundant cell array, the replacement cell array, etc.). The normal cell array NMCA may include memory cells connected to word lines and bit lines, and the redundancy memory cell array RMCA may include memory cells connected to redundancy word lines and/or redundancy bit lines. The repair circuit 124 may include a row repair unit 210 which determines a redundancy row address RRA, such that redundancy resources for repairing and/or replacing a fail row address FRA do not overlap with one another. According to some example embodiments, the row repair unit 210 may sequentially and/or randomly set redundancy row addresses RRA of the redundancy memory cell array RMCA for repairing fail row addresses FRA, but the example embodiments are not limited thereto The row repair unit 210 may perform a row repair operation, such that the redundancy row address RRA is selected for use with memory operations instead of the fail row address FRA. When an access row address applied to the memory device 120 designates the fail row address FRA of the normal cell array NMCA, redundancy memory cells corresponding to the redundancy row address RRA of the redundancy memory cell array RMCA are selected instead as a replacement for the failed memory address, etc. Additionally, the row repair unit 210 deactivates a word line corresponding to the fail row address FRA, and activates a redundancy word line corresponding to the redundancy row address RRA instead. Therefore, redundancy memory cells corresponding to the redundancy row address RRA are selected instead of memory cells corresponding to the fail row address FRA.

In FIG. 3, the repair circuit 124 may perform a column repair operation, such that the redundancy column address RCA is selected instead of the fail column address FCA. The repair circuit 124 may include a column repair unit 220 which determines a redundancy column address RCA, such that redundancy resources for repairing a fail column address FRA do not overlap with one another (e.g., to ensure that individual redundancy column addresses are not assigned to more than one redundancy column addresses, etc.). According to some example embodiments, the column repair unit 220 may sequentially and/or randomly set redundancy column addresses RCA of the redundancy memory cell array RMCA for repairing fail column addresses FCA, but is not limited thereto.

The column repair unit 220 may perform a repair operation, such that the redundancy column address RCA is selected and/or used instead of the fail column address FCA. When an access column address applied to the memory device 120 designates the fail column address FCA of the normal cell array NMCA, redundancy cells corresponding to the redundancy column address RCA of the redundancy cell array RMCA are selected and used instead. The column repair unit 220 avoids and/or prevents a bit line corresponding to the fail column address FCA from being selected, and selects a redundancy bit line corresponding to the redundancy column address RCA instead. Therefore, redundancy cells corresponding to the redundancy column address RCA are selected instead of memory cells corresponding to the fail column address FCA.

The repair circuit 124 may perform a PPR operation and store redundancy mapping information indicating that a fail address (e.g., the fail row address FRA and/or the fail column address FCA) is replaced with a redundancy address (e.g., the redundancy row address RRA and/or the redundancy column address RCA), such that the redundancy address (e.g., the replacement address corresponding to the replacement memory cells, etc.) are used for memory operations whenever the memory address corresponding to the failed memory cells are designated in the address associated with and/or included with a memory operation, etc. Additionally, the repair circuit 124 may store the redundancy mapping information in a table, e.g., a table set in non-volatile memory, such as anti-fuse memory discussed in greater detail in connection with FIG. 5, but the example embodiments are not limited thereto.

The repair circuit 124 may perform a first PPR operation, such that the first redundancy address of redundancy memory cells is selected instead of a first fail address of a first fail memory cell detected in the normal memory cell array NMCA. The repair circuit 124 may generate and/or store a first redundancy mapping of the first fail address to the first redundancy address according to and/or based on the first PPR operation. The repair circuit 124 may compare a second fail address of a second fail memory cell detected in the normal memory cell array NMCA with the first fail address (and/or other stored addresses corresponding to failed memory cells, etc.). As a result of the comparison, when the second fail address matches the first fail address, the repair circuit 124 may ignore the first redundancy mapping and generate a dirty signal DIRTY (see FIG. 4) configured to instruct, generate, and/or create a second redundancy mapping of the first fail address to a second redundancy address different from the first redundancy address, but the example embodiments are not limited thereto. Additionally, the repair circuit 124 may check and/or determine whether there is sufficient space to store the second redundancy mapping of the second fail address of the second fail memory cell to the second redundancy address in the redundancy mapping table, and may generate an overflow flag signal OVF (see FIG. 4) indicating that there is insufficient space based on the results of the determination. The repair circuit 124 may store repair operation conditions, such that the first fail address and the second fail address are PPRed to the first redundancy address and the second redundancy address, respectively, but the example embodiments are not limited thereto. According to some example embodiments, the repair circuit 124 may sequentially set the first redundancy address and the second redundancy address of the redundancy memory cell array RMCA, but are not limited thereto. According to other example embodiments, the repair circuit 124 may randomly set the first redundancy address and the second redundancy address of the redundancy memory cell array RMCA, such that the first redundancy address and the second redundancy address are not identical to each other, etc.

A test result output circuit 126 may output dirty signals DIRTY respectively corresponding to the first fail address and the second fail address to the test host 112 through DQ lines of the memory device 120, etc. Also, the test result output circuit 126 may output the overflow flag signal OVF to the test host 112 through a DQ line. The test host 112 may perform at least one second PPR operation for the memory device 120 with reference to the dirty signals DIRTY. When a new fail address is generated in the memory device 120, the test host 112 may process the memory device 120 as failed with reference to the overflow flag signal OVF.

Figure 4:
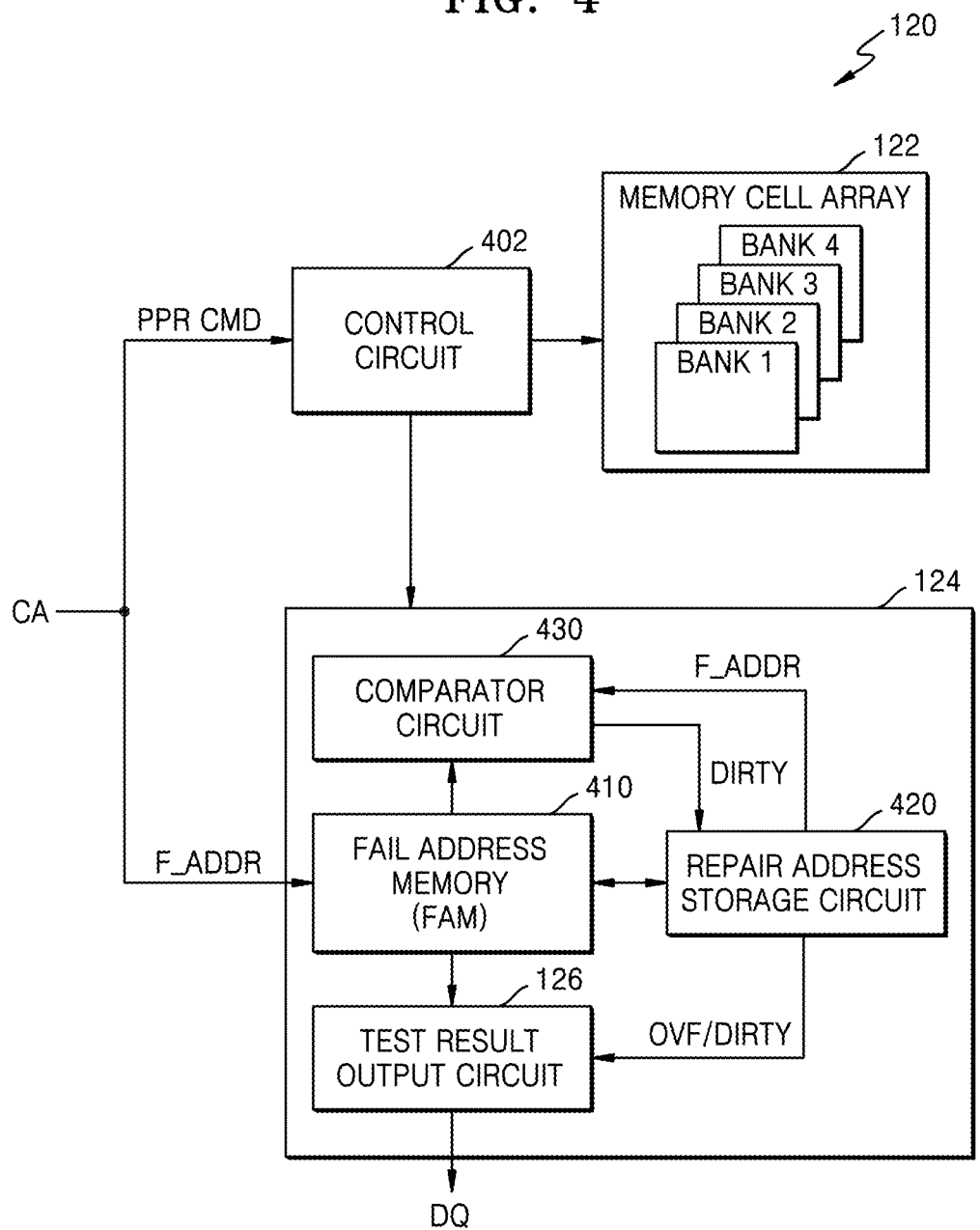
FIG. 4 is a block diagram for illustrating a memory device according to at least one example embodiment.
Figure 6:
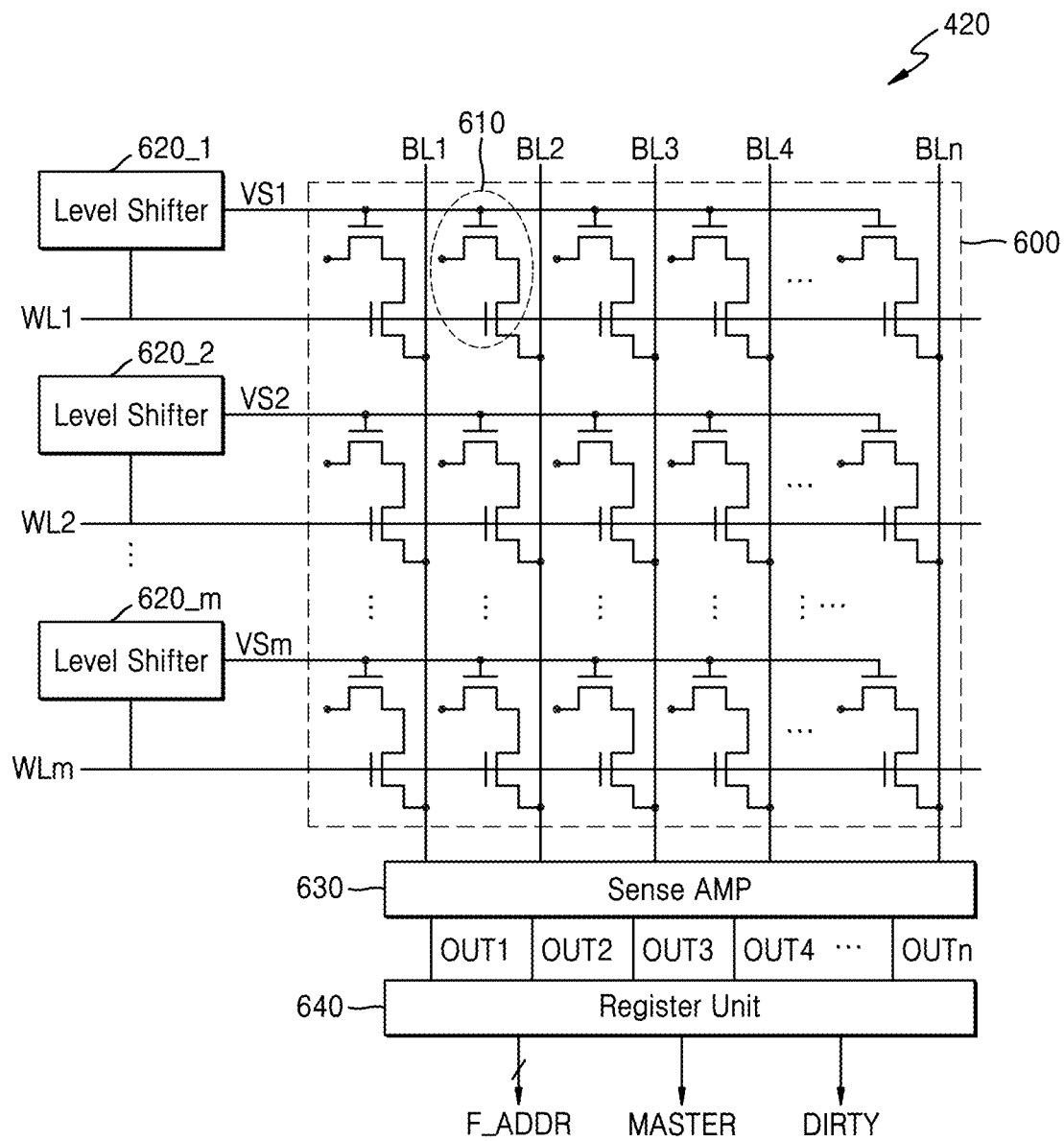

FIG. 4 is a block diagram for illustrating the memory device 120 according to at least one example embodiment. FIG. 5 is a diagram for illustrating a fail address memory (FAM) 410 of FIG. 4 according to at least one example embodiment. FIGS. 6 to 8 are diagrams for illustrating a repair address storage circuit 420 of FIG. 4 according to at least one example embodiment.

Referring to FIG. 4 in conjunction with FIGS. 1 to 3, the memory device 120 may include the memory cell array 122, a control circuit 402, and the repair circuit 124. Although not shown in FIG. 4, the memory device 120 may further include a row decoder, a word line driver, a column decoder, a read/write circuit, a clock circuit, an address buffer, an MRS, and/or an input/output circuit, etc. Also, the memory device 120 shown in FIG. 4 as an example does not represent or imply limitations on the example embodiments of the inventive concepts.

The memory cell array 122 may include a plurality of memory banks, e.g., first to fourth banks BANK1 to BANK4, etc. Row decoders and column decoders may be arranged in correspondence to the first to fourth banks BANK1 to BANK4, respectively, and a row decoder and a column decoder connected to a bank corresponding to a bank address may be activated. The first to fourth banks BANK1 to BANK4 may each include a plurality of memory cells arranged in a matrix form including rows and columns and redundancy memory cells connected to redundancy rows and/or redundancy columns, but are not limited thereto.

The control circuit 402 may receive at least one command through a CA bus of the channel 130 and generate control signals corresponding to and/or based on the command. A memory operation may be performed at an operation timing of the memory device 120 controlled by the control circuit 402. For example, the control circuit 402 may receive a PPR command PPR CMD from the test host 112 during package testing and control the repair circuit 124 to perform a repair operation according to the PPR command PPR CMD, etc.

The repair circuit 124 may include the FAM 410, the repair address storage circuit 420, a comparison circuit 430, and/or the test result output circuit 126, etc., but is not limited thereto. Also, the repair circuit 124 may further include the row repair unit 210 and/or the column repair unit 220 described with reference to FIGS. 2 and 3. The control circuit 402, repair circuit 124, the FAM 410, the repair address storage circuit 420, a comparison circuit 430, and/or the test result output circuit 126, etc., may be implemented as processing circuitry, and may include hardware including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto.

The FAM 410 may receive a fail address F_ADDR associated with the PPR command PPR CMD through the CA bus of the channel 130 and store the fail address F_ADDR. According to at least one example embodiment, the fail address F_ADDR is provided from the test host 112, wherein the fail address F_ADDR may be detected in an EDS test and/or a package test and provided to the memory device 120, but the example embodiments are not limited thereto. The FAM 410 may be implemented as a register array that stores the fail address F_ADDR. According to some example embodiments, the FAM 410 may be configured as SRAM and/or a non-volatile memory, etc.

The fail address F_ADDR stored in the FAM 410 may correspond to the fail row address FRA and/or the fail column address FCA described with reference to FIGS. 2 and 3, but the example embodiments are not limited thereto. The repair circuit 124 may replace the fail row address FRA and/or the fail column address FCA with the redundancy row address RRA and/or the redundancy column address RCA by using the row repair unit 210 and/or the column repair unit 220, etc.

The FAM 410 may include at least one register 520 storing a master signal MASTER and at least one register 510 storing the fail address F_ADDR, as shown in FIG. 5, but the example embodiments are not limited thereto. The fail address F_ADDR may include a bank address and a row address [BA:RA] of the memory cell array 122, but is not limited thereto. Fail addresses F_ADDR may be fail addresses detected during an EDS test and/or a package test of the memory device 120, but the example embodiments are not limited thereto. The fail address F_ADDR may correspond to the fail row address FRA of FIG. 2, but is not limited thereto. According to some example embodiments, the fail address F_ADDR may correspond to the fail column address FCA of FIG. 3 including a bank address and a column address of the memory cell array 122, but is not limited thereto.

FIG. 5 shows an example in which a register array 500 of the FAM 410 stores a plurality of fail addresses, e.g., eight fail addresses F_ADDR corresponding to indices 1 to 8, etc. The eight fail addresses F_ADDR may include eight fail row addresses FRA each including a bank address and a row address [BA:RA], but is not limited thereto. The repair circuit 124 may perform a PPR operation on each of the eight fail row addresses FRA to replace them with the redundancy row addresses RRA, activate the master signal MASTER of the FAM 410 to a bit value of "1", and store the master signal MASTER in the register 520. An activated master signal MASTER is a signal representing the redundancy mapping of the fail row address FRA to the redundancy row address RRA. In other words, the activated master signal MASTER indicates that a PPR operation has been performed on the fail address F_ADDR and the redundancy mapping of the fail address F_ADDR to a redundant address has been completed.

As shown in FIG. 6, the repair address storage circuit 420 may include a fuse array 600 in which a plurality of anti-fuses 610 are arranged, level shifters 620_1 to 620_$m$ which generate high voltages for changing the resistance state of the anti-fuses 610, and/or a sense amplifier 630 for sensing/amplifying information stored in the fuse array 600, but the example embodiments are not limited thereto, and for example, other non-volatile memory may be used instead of the fuse array 600, etc. Also, a register unit 640 for storing fuse data generated by reading information stored in the fuse array 600 may be included in the repair address storage circuit 420, but the example embodiments are not limited thereto.

The fuse array 600 includes a plurality of fuses, and information and/or data is stored in (e.g., represented in) each fuse. The fuse array 600 may include a laser fuse of which connection is controlled by laser irradiation and/or an electrical fuse of which connection is controlled by an electrical signal, but the example embodiments are not limited thereto. Additionally, the fuse array 600 may include anti-fuses, wherein an anti-fuse has a characteristic where its state is changed from a high resistance state to a low resistance state by an electrical signal (e.g., a high voltage signal). Any one of the types of fuses as described above may be applied to the fuse array 600, but, in the example embodiments discussed below, it is assumed that the fuse array 600 is an anti-fuse array having anti-fuses for a PPR operation for the sake of clarity and brevity, but the example embodiments are not limited thereto. The fuse array 600 may be interchangeably referred to as an anti-fuse array 600. Also, information stored in anti-fuses and/or data read from anti-fuses are referred to as fuse data.

The anti-fuse array 600 has an array structure in which the anti-fuses 610 are arranged at positions where a plurality of rows intersect with a plurality of columns. For example, when the anti-fuse array 600 has m rows and n columns, the anti-fuse array 600 includes m*n anti-fuses 610. Additionally, m word lines WL1 to WLm for accessing the anti-fuses 610 arranged in m rows and n bit lines BL1 to BLn arranged in correspondence to n columns for transmitting information read from the anti-fuses 610 are provided in the anti-fuse array 600.

The anti-fuse array 600 is programmed by applying voltage signals VS1 to VSm respectively provided from the level shifters 620_1 to 620_$m$ to the anti-fuse array 600 to change the state of the anti-fuses 610, but the example embodiments are not limited thereto. An anti-fuse 610 is initially in a high resistance state and may be changed to a low resistance state by a programming operation and store information. The anti-fuse 610 may have a structure having two conductive layers and a dielectric layer therebetween, e.g., a capacitor structure, and may programmed by breaking down the dielectric layer by applying a high voltage between the two conductive layers, but the example embodiments are not limited thereto.

After the anti-fuse array 600 is programmed, a read operation on the anti-fuse array 600 may be performed together with the start of driving of the memory device 120, or in other words, the read operation may be performed on the anti-fuse array 600 at the start of operation on the memory device 120, etc., but is not limited thereto. The read operation on the anti-fuse array 600 may be performed simultaneously with the driving of the memory device 120 or may be performed after a certain and/or desired set time has elapsed from the driving of the memory device 120. A word line select signal may be provided through the word lines WL1 to WLm of the anti-fuse array 600, and information and/or data stored in a selected anti-fuse 610 may be provided to the sense amplifier 630 through the bit lines BL1 to BLn. Due to the characteristics of an array structure, information of the anti-fuse array 600 may be accessed randomly by driving the word lines WL1 to WLm and the bit lines BL1 to BLn, but is not limited thereto.

For example, as the word lines WL1 to WLm are sequentially driven, the anti-fuses 610 from a first row to an m-the row of the anti-fuse array 600 may be sequentially accessed. Information of the sequentially accessed anti-fuses 610 may be provided to the sense amplifier 630. The sense amplifier 630 may include one or more sense amplifier circuits. For example, when the anti-fuse array 600 has n columns, the sense amplifier 630 may include n sense amplifier circuits in correspondence thereto, but is not limited thereto. The n sense amplifier circuits may be respectively connected to the n bit lines BL1 to BLn.

The sense amplifier 630 may sense, amplify, and/or output information accessed by the anti-fuse array 600 as fuse data OUT1 to OUTn. The fuse data OUT1 to OUTn output from the sense amplifier 630 are provided to the register unit 640. The register unit 640 may receive the fuse data OUT1 to OUTn row-by-row of the anti-fuse array 600. For example, when any one row of the anti-fuse array 600 is selected, the fuse data OUT1 to OUTn from the anti-fuses 610 connected to a word line of the selected row may be provided to the register unit 640 in parallel. The fuse data OUT1 to OUTn stored in the register unit 640 may be provided to the comparison circuit 430 as information for a repair operation, but is not limited thereto.

As shown in FIG. 7, the anti-fuse array 600 may include an anti-fuse region 720 for storing the master signal MASTER, an anti-fuse region 730 for storing the dirty signal DIRTY, and/or an anti-fuse region 710 for storing the fail address F_ADDR, etc. The master signal MASTER and the fail address F_ADDR of FIG. 7 correspond to the master signal MASTER and the fail address F_ADDR stored in the register array 500 of the FAM 410 of FIG. 5, respectively, but the example embodiments are not limited thereto. In other words, the anti-fuse array 600 may store the master signal MASTER indicating a redundancy mapping for one or more of the plurality of fail addresses F_ADDR, e.g., fail addresses corresponding to the indices 1 to 8, etc.

As an example, in the register array 500 of the FAM 410 shown in FIG. 5, eight fail addresses F_ADDR respectively corresponding to the indices 1 to 8 may be new fail addresses different from one another, but the example embodiments are not limited thereto. The repair circuit 124 may determine the eight fail addresses F_ADDR to be new fail addresses and may store the dirty signal DIRTY in the anti-fuse region 730 in an inactive state (e.g., by default) having a bit value of "0", but is not limited thereto.

The repair circuit 124 may receive a new fail address F_ADDR corresponding to an index 9, e.g., a ninth fail address mapping, etc. The new fail address F_ADDR corresponding to the index 9 may be stored in the FAM 410, and as shown in FIG. 8, stored in the anti-fuse array 600, but the example embodiments are not limited thereto.

In FIG. 8, for example, the new fail address F_ADDR corresponding to the index 9 may be the same as an existing fail address F_ADDR corresponding to an index 5. In other words, the new fail address F_ADDR corresponding to the index 9 and the existing fail address F_ADDR corresponding to the index 5 may be the same, e.g., "0001010000," but the example embodiments are not limited thereto. The repair circuit 124 may determine, through the comparing circuit 430 (e.g., FIG. 4), that the new fail address F_ADDR corresponding to the index 9 in the register array 500 of the FAM 410 matches the a stored fail address, e.g., the fail address F_ADDR corresponding to the index 5 in the repair address storage circuit 420. The repair circuit 124 may determine that a redundancy address associated with the existing fail address F_ADDR corresponding to the index 5 that has been replaced by a PPR operation for the past failed memory operations, etc. The repair circuit 124 may activate the dirty signal DIRTY corresponding to the index 5 to a bit value of "1" and store the dirty signal DIRTY in the anti-fuse region 600 to decrease and/or minimize the existing redundancy mapping for the existing fail address F_ADDR corresponding to the index 5 to a fail redundancy address.

The activated dirty signal DIRTY may be provided to the test result output circuit 126 and may be transmitted to the test host 112 through the data line. The test host 112 may receive the activated dirty signal DIRTY and issue a new PPR command PPR CMD to the memory device 120. According to the new PPR command PPR CMD, the memory device 120 may perform a PPR operation for decreasing and/or minimizing the existing redundancy mapping of the fail address F_ADDR corresponding to the index 5 to a fail redundancy address provided by the repair circuit 124, and replacing the new fail address F_ADDR corresponding to the index 9 with a new redundancy address. The repair circuit 124 may store a new redundancy mapping of the new fail address F_ADDR corresponding to the index 9 to a new redundancy address (e.g., a unique redundancy address, etc.). After performing a PPR operation on the new fail address F_ADDR corresponding to the index 9, the repair circuit 124 may activate the master signal MASTER for the new fail address F_ADDR to a bit value of "1" and store the master signal MASTER in the anti-fuse region 730.

Referring back to FIG. 4, the comparison circuit 430 may compare the fail address F_ADDR stored in the FAM 410 with the fuse data OUT1 to OUTn provided from the repair address storage circuit 420. The fuse data OUT1 to OUTn may include the fail address F_ADDR, the master signal MASTER, and the dirty signal DIRTY stored in the anti-fuse array 600, but is not limited thereto. The comparison circuit 430 may compare the fail address F_ADDR stored in the FAM 410 with the fail address F_ADDR from among the pieces of fuse data OUT1 to OUTn provided from the repair address storage circuit 420. As a result of the comparison, when the fail address F_ADDR stored in the FAM 410 does not match the fuse data OUT1 to OUTn, the fail address F_ADDR stored in the FAM 410 may be determined to be a new and/or valid fail address F_ADDR.

For example, the new fail address F_ADDR may be PPRed by performing, by the repair circuit 124 of FIG. 2, a row repair operation, but is not limited thereto. Additionally, the new fail address F_ADDR may be PPRed by performing, by the repair circuit 124 of FIG. 3, a column repair operation, but is not limited thereto. In other words, the new fail address F_ADDR may be replaced with a new redundancy address. The master signal MASTER indicating the redundancy mapping of the new fail address F_ADDR corresponding to the index 9 (e.g., a ninth redundancy mapping, etc.) to a new redundancy address may be activated to a bit value of "1" and stored in the register 520 of the FAM 410 and the anti-fuse region 720 of the anti-fuse array 600. In this case, the dirty signal DIRTY for the new fail address F_ADDR corresponding to index 9 may be stored in the anti-fuse region 730 in an inactive state (e.g., the dirty signal may be cleared) with a bit value of "0".

In addition, the repair circuit 124 may determine that the storage capacity of the register 520 of the FAM 410 and/or the anti-fuse array 600 to which a new fail address F_ADDR may be allocated is insufficient. The repair circuit 124 may generate the overflow flag signal OVF indicating that the storage capacity of the register 520 of the FAM 410 and/or the anti-fuse array 600 has been exceeded when any additional new fail address F_ADDR occurs (e.g., are received). The overflow flag signal OVF may be provided to the test result output circuit 126.

The test result output circuit 126 may transmit the overflow flag signal OVF to the test host 112 through the data DQ line of the channel 130. When the overflow flag signal OVF is received and a new fail address F_ADDR is generated in the memory device 120, the test host 112 may process the memory device 120 as a failed memory operation, etc.

When the comparison circuit 430 compares the fail address F_ADDR stored in the FAM 410 with the fail address F_ADDR stored in the repair address storage circuit 420, the fail address F_ADDR stored in the FAM 410 may match a fail address F_ADDR stored in the repair address storage circuit 420. Matching means that the fail address F_ADDR stored in the FAM 410 is related to an existing fail address stored in the repair address storage circuit 420.

When the fail address F_ADDR of the FAM 410 matches the fail address F_ADDR of the repair address storage circuit 420, the comparison circuit 430 may determine that a redundancy address associated with the fail address F_ADDR replaced in a PPR operation in the past failed. Therefore, it is desired and/or necessary to ignore an existing redundancy mapping of the fail address F_ADDR corresponding to a fail redundancy address stored in the repair circuit 124, and update the redundancy mapping information to replace the ignored fail address F_ADDR with a new redundancy address D_ADDR. The comparison circuit 430 may generate a dirty signal DIRTY instructing to decrease and/or minimize the existing redundancy mapping for the fail address F_ADDR to a fail redundancy address, and to perform a new redundancy mapping to a new redundancy address. The dirty signal DIRTY may be stored in the repair address storage circuit 420 and may be provided to the test result output circuit 126.

The test result output circuit 126 may transmit the dirty signal DIRTY from among the pieces of fuse data OUT1 to OUTn provided from the repair address storage circuit 420 to the test host 112 through the data line of the channel 130, but is not limited thereto. The test host 112 may receive the dirty signal DIRTY, issue a PPR command PPR CMD, and transmit the PPR command PPR CMD to the memory device 120. The memory device 120 may perform a PPR operation according to the PPR command PPR CMD. In other words, the memory device 120 may perform a PPR operation of minimizing the existing redundancy mapping for the fail address F_ADDR to a fail redundancy address by the repair circuit 124 and replacing the fail address F_ADDR with a new redundancy address. The repair circuit 124 may store a new redundancy mapping of the fail address F_ADDR to a new redundancy address.

Figure 9:
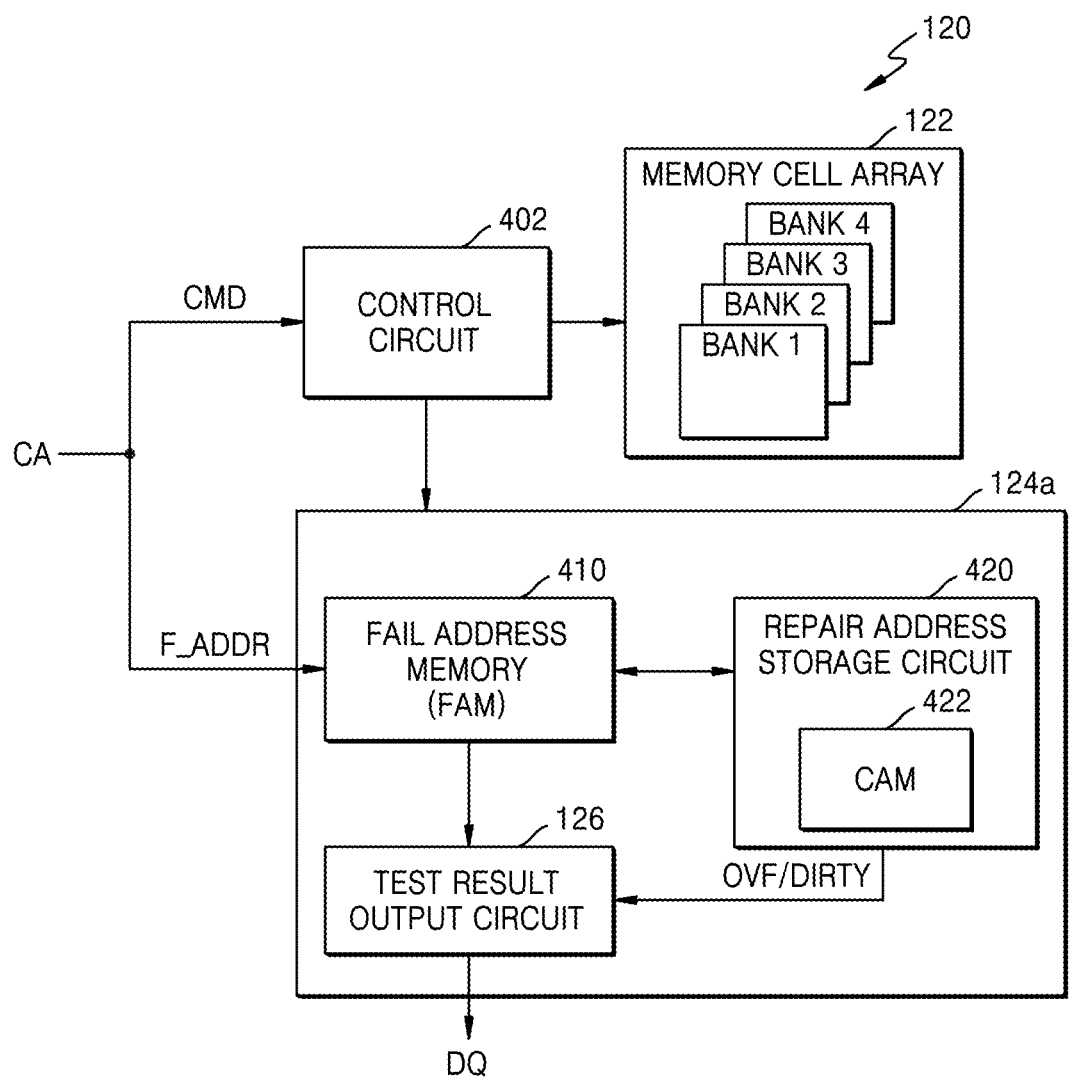
FIG. 9 is a block diagram for illustrating a memory device according to at least one example embodiment.

FIG. 9 is a block diagram for illustrating the memory device 120 according to at least one example embodiment. The memory device 120 of FIG. 9 is different from that of FIG. 4 in that a repair circuit 124a does not include the comparison circuit 430, but the example embodiments are not limited thereto. Hereinafter, descriptions regarding the memory device 120 identical to those given above with reference to FIG. 4 are omitted. Also, the characters attached to the reference numbers (e.g., a of 124a) are for distinguishing a plurality of circuits having the same function.

The repair address storage circuit 420 may include a content addressable memory (CAM) 422, but is not limited thereto. The CAM 422 may simultaneously compare the fail address F_ADDR stored in the FAM 410 with fail addresses F_ADDR stored in respective CAM entries. If an output of the CAM 422 indicates that the fail address F_ADDR of the FAM 410 matches the fail address F_ADDR stored in a CAM entry, the CAM 422 may output the dirty signal DIRTY for decreasing and/or minimizing the existing redundancy mapping of the fail address F_ADDR stored in the CAM entry, and commanding and/or instructing a new redundancy mapping. The repair address storage circuit 420 may store the dirty signal DIRTY output from the CAM 422 and provide the dirty signal DIRTY to the test result output circuit 126, etc.

The repair address storage circuit 420 may determine that the CAM 422 to which the redundancy mapping to a new fail address F_ADDR may be allocated is insufficient. The repair address storage circuit 420 may generate the overflow flag signal OVF indicating that the storage capacity of the CAM 422 has been exceeded when any more new fail address F_ADDR occur. The overflow flag signal OVF may be provided to the test result output circuit 126.

Figure 10:
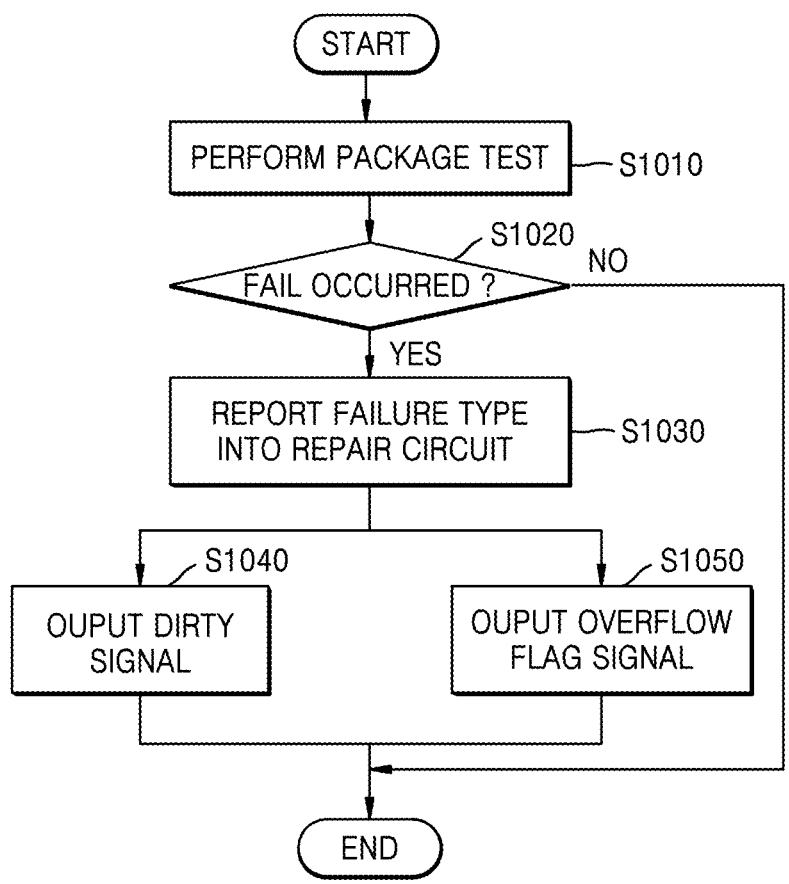
FIG. 10 is a flowchart for illustrating a test operation of a memory device according to some example embodiments.

FIG. 10 is a flowchart for illustrating a test operation of a memory device according to some example embodiments. Referring to FIG. 10, an operation of outputting a post package test result by using repair circuits 124 and 124a shown in FIGS. 4 and 9 is described in detail. Although it is described below that the test operation of FIG. 10 is performed during a package test, the example embodiments of the inventive concepts are not limited thereto. For example, it may be described that the test operation of FIG. 10 is performed during a mounting test and/or a system test, etc.

Referring to FIG. 10 in conjunction with FIGS. 1 to 9, in operation 51010, the memory device 120 may perform a package test using a test program of the test host 112. The test host 112 may store particular data in the memory cell array 122 of the memory device 120, read stored data, and/or determine the pass/fail status of a package test according to whether read data is the same as the particular data (operation S1020).

In operation S1020, when a failure occurs during the package test (YES), the test operation may proceed to operation 51030. When the package test is passed (NO), the memory device 120 may be processed as a non-defective product and the package test may be terminated.

In operation S1030, the memory device 120 may record the type of memory defect and/or failure that occurred in the package test in the repair circuits 124 and 124a. The repair circuits 124 and 124a may each store the fail address F_ADDR detected in the package test in the FAM 410. The fail address F_ADDR may be provided from the test host 112 together with the PPR command PPR CMD, but is not limited thereto.

The repair circuits 124 and 124a may store redundancy mapping information related to a repair operation for the fail address F_ADDR in the repair address storage circuit 420.

The repair circuits 124 and 124a may determine that the storage space of the repair address storage circuit 420 to which a source address S_ADDR and a destination address D_ADDR related to and/or corresponding to the fail address F_ADDR provided from the test host 112 may be allocated is insufficient. The repair circuits 124 and 124*a* may generate the overflow flag signal OVF indicating that the storage capacity of the repair address storage circuit 420 is exceeded when new fail addresses F_ADDR occur. Thereafter, in operation S1050, the memory device 120 may output the overflow flag signal OVF to the test host 112. The test host 112 may refer to the overflow flag signal OVF and, when a new fail address F_ADDR is generated in the memory device 120, the test host 112 may process the memory device 120 as fail.

The repair circuits 124 and 124*a* may compare the fail address F_ADDR newly stored in the FAM 410 with the fail address F_ADDR stored in the repair address storage circuit 420. When the new fail address F_ADDR of the FAM 410 matches any of the fail address F_ADDR stored in the repair address storage circuit 420, the repair circuits 124 and 124*a* may each generate the dirty signal DIRTY and store the dirty signal DIRTY in the repair address storage circuit 420. Thereafter, in operation 51040, the memory device 120 may output the dirty signal DIRTY to the test host 112. The test host 112 may transmit the PPR command PPR CMD to the memory device 120 to perform a new PPR operation with reference to the dirty signal DIRTY. The memory device 120 may perform a new PPR operation for decreasing and/or minimizing an existing redundancy mapping related to the fail address F_ADDR stored in the repair address storage circuit 420 and replacing the fail address F_ADDR with a new redundancy address according to the new PPR command PPR CMD, and may store new redundancy mapping information for the fail address F_ADDR to the new redundancy address in the FAM 410 and the repair address storage circuit 420.

Figure 11:
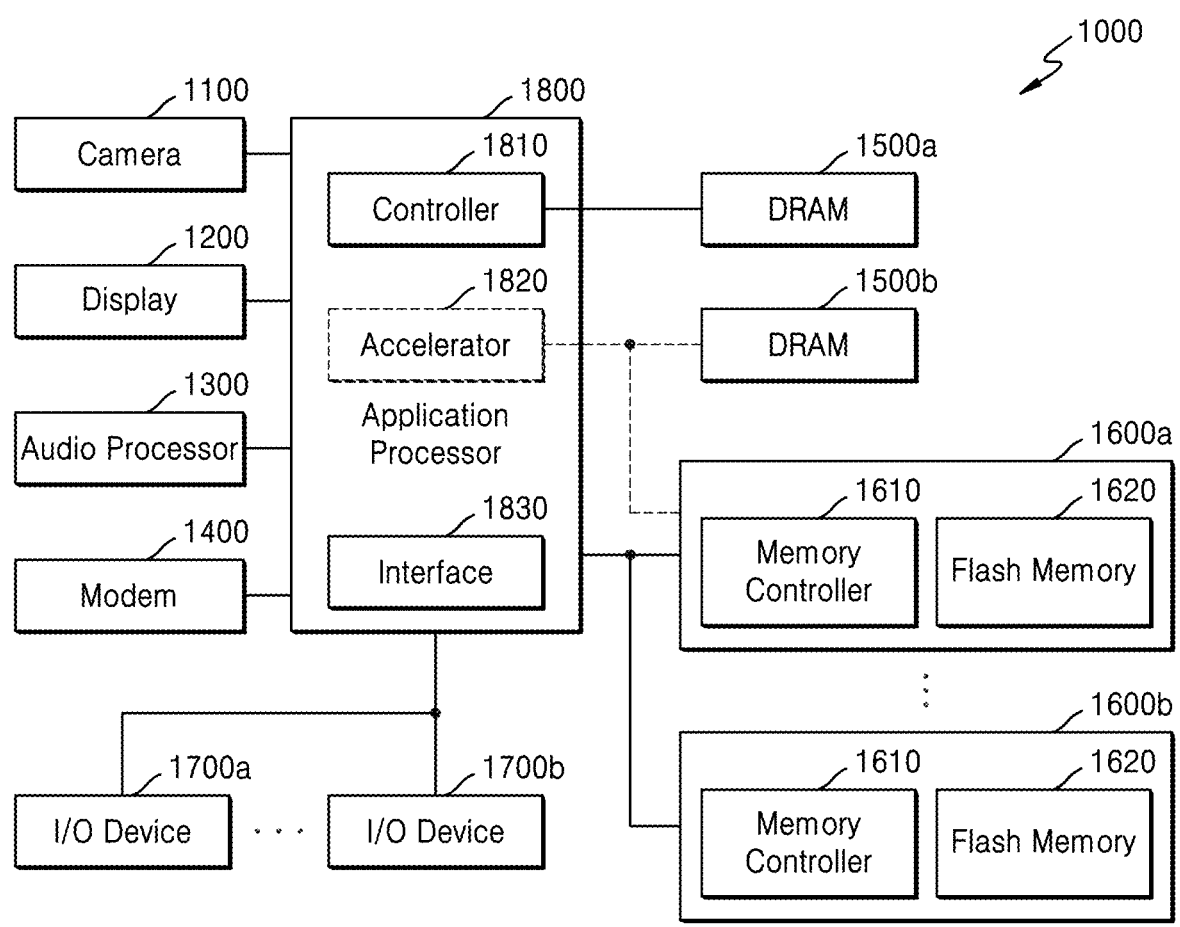
FIG. 11 is a block diagram for illustrating a system including a memory device according to some example embodiments.

FIG. 11 is a block diagram for illustrating a system 1000 including a memory device according to some example embodiments.

Referring to FIG. 11, the system 1000 may include a camera 1100, a display 1200, an audio processor 1300, a modem 1400, DRAMs 1500*a* and 1500*b*, flash memories 1600*a* and 1600*b*, I/O devices 1700*a* and 1700*b*, and/or an application processor (AP) 1800, etc., but the example embodiments are not limited thereto. The system 1000 may be implemented as a smartphone, a tablet, a personal computer (PC), a wearable device, a healthcare device, a robotic device, an autonomous device, and/or an Internet Of Things (IoT) device, etc. Also, the system 1000 may be implemented as a server, etc.

The camera 1100 may capture a still image and/or a video according to a user's control and may store captured image/video data and/or transmit the captured image/video data to the display 1200. The audio processor 1300 may process audio data included in the flash memories 1600*a* and/or 1600*b* and/or network content. The modem 1400 may transmit a modulated signal for wired/wireless data transmission/reception to a receiver and the modulated signal may be demodulated by the receiver to restore an original signal. The I/O devices 1700*a* and 1700*b* may include devices providing a digital input function and/or digital output function, e.g., a Universal Serial Bus (USB), a storage, a digital camera, a Secure Digital (SD) card, a Digital Versatile Disc (DVD), a network adapter, a touch screen, etc.

The AP 1800 may control the overall operation of the system 1000, but the example embodiments are not limited thereto. The AP 1800 may control the display 1200, such that at least a part of content stored in, e.g., the flash memories 1600*a* and/or 1600*b*, etc., is displayed on the display 1200. When a user input is received through the I/O devices 1700*a* and/or 1700*b*, the AP 1800 may perform a control operation corresponding to and/or based on the user input, but is not limited thereto. The AP 1800 may include an accelerator block (e.g., accelerator circuitry, etc.), which is a circuit dedicated for calculation of Artificial Intelligence (AI) data, and/or may include an accelerator chip 1820 separately from the AP 1800, but the example embodiments are not limited thereto. The DRAM 1500*b* may be additionally provided in the accelerator block and/or the accelerator chip 1820. The accelerator block is a functional block that specializes in performing a particular function of the AP 1800, and may include a GPU, which is a functional block that specializes in processing graphic data, a neural processing unit (NPU), which is a block that specializes in AI calculation and inference, and/or a data processing unit (DPU), which is a block that specializes in data transmission, etc.

The system 1000 may include DRAMs 1500*a* and/or 1500*b*, etc. The AP 1800 may set up a DRAM interface protocol and communicate with the DRAMs 1500*a* and/or 1500*b* to control the DRAMs 1500*a* and/or 1500*b* through commands complying with the Joint Electron Device Engineering Council (JEDEC) standard and mode register (MRS) setting and/or to use company-specific functions like low voltage/high-speed/reliability and a cyclic redundancy check (CRC)/error correction code (ECC) function, etc. For example, the AP 1800 may communicate with the DRAM 1500*a* through an interface complying with the JEDEC standards like LPDDR4 and LPDDR5, etc., and the accelerator block and/or the accelerator chip 1820 may set and use a new DRAM interface protocol to control the DRAM 1500*b* for an accelerator, which has a greater bandwidth than the DRAM 1500*a*.

Although FIG. 11 shows only the DRAMs 1500*a* and 1500*b*, the example embodiments of the inventive concepts are not limited thereto. As long as a bandwidth, a response speed, and/or voltage conditions of the AP 1800 and/or the accelerator chip 1820 are satisfied, any memory like PRAM, SRAM, MRAM, RRAM, FRAM, or Hybrid RAM, etc., may be used. The DRAMs 1500*a* and 1500*b* have relatively smaller latency and bandwidth than the I/O devices 1700*a* and 1700*b* and/or the flash memories 1600*a* and 1600*b*. The DRAMs 1500*a* and 1500*b* are initialized when the system 1000 is powered on and the OS and application data are loaded thereto, and thus the DRAMs 1500*a* and 1500*b* may be used as temporary storages for the OS and the application data or may be used as execution spaces for various software code.

In the DRAMs 1500*a* and 1500*b*, at least four arithmetic operations (e.g., addition, subtraction, multiplication, and division), vector calculations, address calculations, and/or Fast Fourier Transform (FFT) calculations may be performed. Also, in the DRAMs 1500*a* and 1500*b*, a function for an operation used for an inference may be performed. Here, the inference may be performed in a deep learning algorithm using an artificial neural network. The deep learning algorithm may include a training operation for learning a model through various data and an inference operation for recognizing data with the trained model, but the example embodiments are not limited thereto. According to at least one example embodiment, an image captured by a user through the camera 1100 is signal-processed and stored in the DRAM 1500*b*, and the accelerator block and/or accelerator chip 1820 may perform AI data calculation for recognizing data using data stored in the DRAM 1500*b* and a function used for inference.

The system 1000 may include a plurality of storage devices and/or flash memories 1600*a* and 1600*b* having a larger capacity than the DRAMs 1500a and 1500b. The accelerator block and/or the accelerator chip 1820 may perform a training operation and an AI data calculation using the flash memories 1600a and/or 1600b. According to at least one example embodiment, the flash memories 1600a and 1600b may efficiently perform the training operation and the inference operation for AI data calculation, which are performed by the AP 1800 and/or the accelerator chip 1820 using a computing device provided in the memory controller 1610, but the example embodiments are not limited thereto. The flash memories 1600a and 1600b may store images captured through the camera 1100 and/or data transmitted through a data network, etc. For example, the flash memories 1600a and 1600b may store Augmented Reality/Virtual Reality content, High Definition (HD) content, and/or Ultra High Definition (UHD) content, etc.

In the system 1000, the DRAMs 1500a and 1500b may each include a repair circuit as described with reference to FIGS. 1 to 10, but is not limited thereto. The DRAMs 1500a and 1500b may each include a repair circuit which performs a PPR operation during a system test. The repair circuit 124 may perform a first repair operation, such that the first redundancy address of redundancy memory cells are selected instead of a first fail address of a first fail memory cell detected in the DRAMs 1500a and 1500b. The repair circuit may store first redundancy mapping of the first fail address to the first redundancy address according to and/or based on the results of the first repair operation. The repair circuit may compare a second fail address of a second fail memory cell detected in the DRAMs 1500a and 1500b with the first fail address. As a result of the comparison, when the second fail address matches the first fail address, the repair circuit may ignore the first redundancy mapping and may generate a dirty signal configured to instruct and/or cause a second redundancy mapping of the first fail address to a second redundancy address different from the first redundancy address of the redundancy memory cells. The repair circuit may generate an overflow flag signal indicating that there is insufficient space to store second redundancy mapping information for the second fail address of the second fail memory cell to the second redundancy address. The DRAMs 1500a and 1500b may output an overflow flag signal provided from the repair circuit 124, and dirty signals respectively corresponding to the first fail address and the second fail address to a test host through data lines of the DRAMs 1500a and 1500b. The test host may perform a second repair operation for the DRAMs 1500a and 1500b with reference to the dirty signals and, when a new fail address is generated in the DRAMs 1500a and 1500b with reference to the overflow flag signal OVF, process the DRAMs 1500a and 1500b as having failed the system test.

While various example embodiments of the inventive concepts have been particularly shown and described, it will be understood that various changes in form and details may be made therein without departing from the spirit and scope of the following claims.

What is claimed is:

1. A memory device comprising:
a memory cell array comprising a plurality of memory cells arranged at intersections of a plurality of rows, and a plurality of columns and redundancy memory cells configured to repair a failed memory cell from among the memory cells; and
a repair circuit configured to perform a repair operation on the failed memory cell, and output a dirty signal to an external destination external to the memory device, the repair operation including,
selecting a first redundancy address of the redundancy memory cells instead of a first fail address of a first failed memory cell,
storing a first redundancy mapping for the first fail address to the first redundancy address, and,
in response to determining a second fail address of a second failed memory cell matches the first redundancy address,
ignoring the first redundancy mapping, and
outputting the dirty signal causing a second redundancy mapping to map the first fail address to a second redundancy address different from the first redundancy address of the redundancy memory cells.

2. The memory device of claim 1, wherein the repair circuit is further configured to store the first fail address, the first redundancy mapping for the first fail address, and the dirty signal corresponding to the first fail address.

3. The memory device of claim 2, wherein the repair circuit comprises an anti-fuse array.

4. The memory device of claim 2, wherein, in response to the second fail address matching the first fail address of the first redundancy mapping, the repair circuit is further configured to activate the dirty signal corresponding to the first fail address.

5. The memory device of claim 4, wherein the memory device is configured to transmit the activated dirty signal to a test host device external to the memory device through a data line of the memory device.

6. The memory device of claim 2, wherein the repair circuit further is further configured to store the first fail address in correspondence with the second fail address.

7. The memory device of claim 6, wherein the repair circuit further is further configured to generate the dirty signal by comparing the first fail address stored in the repair circuit with the second fail address.

8. The memory device of claim 6, wherein the repair circuit further comprises a register array.

9. The memory device of claim 6, wherein
the repair circuit comprises a content addressable memory (CAM) configured to store the first fail address of the first redundancy mapping; and
the repair circuit is further configured to,
compare the first fail address stored in the CAM with the a previously stored second fail address, and
generate the dirty signal.

10. A memory device comprising:
a memory cell array comprising a plurality of memory cells arranged at intersections of a plurality of rows and a plurality of columns, and redundancy memory cells configured to repair a failed memory cell from among the plurality of memory cells; and
a repair circuit configured to,
perform a repair operation on the failed memory cell, and output an overflow flag signal to an external destination external to the memory device, the repair operation including,
selecting a first redundancy address of the redundancy memory cells instead of a first fail address of a first failed memory cell from among the plurality of memory cells,
storing a first redundancy mapping for the first fail address to the first redundancy address, and
outputting the overflow flag signal indicating that a storage space to store a second redundancy mapping for a second fail address of a second failed memory cell from among the plurality of memory cells to a second redundancy address is insufficient.

11. The memory device of claim 10, wherein the memory device is configured to output the overflow flag signal to a test host external to the memory device through a data line of the memory device.

12. The memory device of claim 10, wherein the repair circuit is configured to store the first fail address.

13. The memory device of claim 12, wherein the repair circuit further comprises an anti-fuse array configured to store the first fail address and the first redundancy mapping for the first fail address.

14. The memory device of claim 13, wherein the repair circuit is further configured to generate the overflow flag signal in response to a new fail address that is not storable in the anti-fuse array being generated.

15. The memory device of claim 12, wherein the repair circuit is further configured to:
store the first redundancy mapping; and
generate the overflow flag signal in response to a new fail address that is not storable in the repair circuit being generated.

16. A memory device comprising:
a memory cell array comprising a plurality of memory cells arranged at intersections of a plurality of rows and a plurality of columns, and a plurality of redundancy memory cells configured to repair a failed memory cell from among the plurality of memory cells; and
a repair circuit configured to,
perform a memory test operation on the memory cell array after performing a repair operation on the failed memory cell with a first redundancy memory cell of the plurality of redundancy memory cells, and
output a first signal to an external destination external to the memory device, the first signal being obtained as a result of the memory test operation and indicating failure of the first redundancy memory cell.

17. The memory device of claim 16, wherein the repair circuit is further configured to transmit the first signal to a test host external to the memory device through a data line of the memory device.

18. The memory device of claim 16, wherein the repair circuit is further configured to store one or more fail addresses obtained as a result of the memory test operation.

19. The memory device of claim 18, wherein the repair circuit is further configured to output, to the external destination, a second signal indicating that a number of fail addresses to be stored exceeds a number of fail addresses that can be stored in the repair circuit.

20. The memory device of claim 19, wherein the memory device is further configured to transmit the second signal to a test host external to the memory device through a data line of the memory device.

* * * * *